United States Patent [19]
Saitoh

[11] Patent Number: 5,891,773
[45] Date of Patent: Apr. 6, 1999

[54] NON-VOLATILE SEMICONDUCTOR STORAGE APPARATUS AND PRODUCTION THEREOF

[75] Inventor: Kenji Saitoh, Tokyo, Japan

[73] Assignee: NEC Corporation, Tokyo, Japan

[21] Appl. No.: 898,960

[22] Filed: Jul. 23, 1997

Related U.S. Application Data

[63] Continuation of Ser. No. 604,387, Feb. 21, 1996, abandoned.

[30] Foreign Application Priority Data

Mar. 10, 1995 [JP] Japan .................................. 7-078455

[51] Int. Cl.$^6$ ............................................... H01L 21/8247
[52] U.S. Cl. ............................ 438/259; 438/264; 438/263
[58] Field of Search ................................... 438/259, 264, 438/263

[56] References Cited

U.S. PATENT DOCUMENTS

| | | | |
|---|---|---|---|
| 5,135,879 | 8/1992 | Richardson | 437/43 |
| 5,180,680 | 1/1993 | Yang | 437/38 |
| 5,379,255 | 1/1995 | Shah | 365/185 |
| 5,382,540 | 1/1995 | Sharma et al. | 437/52 |
| 5,460,988 | 10/1995 | Hong | 437/43 |
| 5,554,550 | 9/1996 | Yang | 437/43 |

FOREIGN PATENT DOCUMENTS 6112503  4/1994  Japan .

OTHER PUBLICATIONS

H.B. Pein et al.; "Performance of the 3–D Sidewall Flash EPROM Cell"; IEEE IEDM 93.2.1, 1993, pp. 2.1.1–2.1.4, no month provided.

*Primary Examiner*—John Niebling
*Assistant Examiner*—Richard A. Booth
*Attorney, Agent, or Firm*—Whitham, Curtis & Whitham

[57] ABSTRACT

The invention provides a non-volatile semiconductor storage apparatus wherein silicon pillars are formed by epitaxial growth thereby to suppress a dispersion in channel length and improve the quality of a gate oxide film. In production, epitaxial silicon pillars are formed by selective epitaxial growth on a p-type silicon substrate, and a gate oxide film is formed over the overall area. Polycrystalline silicon is deposited and etched back to form a first polycrystalline silicon film serving as floating gates. Ion implantation is performed to form drain regions at the tops of the epitaxial silicon pillars and form a source region on the surface of the silicon substrate. A layered insulation film is formed, and polycrystalline silicon is deposited and etched back to form a second polycrystalline silicon film which covers over the side faces of the floating gates and serves as control gates. Bit lines are formed on the drain regions.

6 Claims, 4 Drawing Sheets

NON-VOLATILE SEMICONDUCTOR STORAGE APPARATUS AND PRODUCTION THEREOF

RELATED APPLICATIONS

This is a continuation of application Ser. No. 08/604,387, filed Feb. 21, 1996, now abandoned.

BACKGROUND OF THE INVENTION

1. Field of the Invention

This invention relates to a non-volatile semiconductor storage apparatus and a process of producing the same, and more particularly to an electrically erasable non-volatile semiconductor storage apparatus which has a three-dimensional structure and a process of producing the same.

2. Description of the Related Art

In recent years, as an increase in storage capacity and degree of integration of semiconductor storage apparatus proceeds, attention is paid to a non-volatile semiconductor storage apparatus having a memory cell of a three-dimensional structure as a semiconductor storage apparatus in which cell arrays can be arranged with a high density. An exemplary one of such non-volatile semiconductor storage apparatus is disclosed in "Performance of the 3-D Sidewall Flash EPROM Cell", IEEE IEDM 93.2.1, 1993.

The structure and a process of production of an EEPROM flash memory are described below with reference to FIGS. 8 and 9. FIG. 8 is a plan view of the conventional three-dimensional EEPROM flash memory, and FIG. 9 is a sectional view taken along line 9'–9" in FIG. 8. As seen from FIGS. 8 and 9, a plurality of p-type silicon pillars 12 formed by etching are arranged in a matrix on a silicon substrate 1. A polycrystalline silicon film 5 serving as a floating gate is formed around each of the silicon pillars 12 with a gate oxide film 4 interposed therebetween.

A drain region 6 is formed at the top of each of the silicon pillars 12, and a source region 7 is formed continuously on the surface of the silicon substrate 1 around the individual silicon pillars 12. A second polycrystalline silicon film 9 serving as a control gate is formed around each of the polycrystalline silicon films 5 serving as floating gates with a layered insulation film 8 interposed therebetween. The second polycrystalline silicon films 9 are formed continuously in the direction of a row to construct word lines. The surfaces of the second polycrystalline silicon films 9 are covered with an interlayer insulation film 10. The drain regions 6 formed on the silicon pillars 12 are connected commonly for the individual columns to bit lines 11 which extend in the direction of a column.

The EEPROM is formed in the following manner.

① An etching mask of a silicon oxide film is formed on a p-type silicon substrate 1, and the silicon substrate 1 is etched by RIE (Reactive Ion Etching) to form silicon pillars 12.

② A gate oxide film 4 is formed by thermal oxidation, and deposition and etching back of polycrystalline silicon are performed to form a polycrystalline silicon film 5 on the side faces of each of the silicon pillars 12.

③ Ion implantation of arsenic is performed to form drain regions 6 and a source region 7.

④ A layered insulation film 8 is formed over the entire area, and deposition and etching back of polycrystalline silicon are performed to form second polycrystalline silicon films 9 which cover over the circumferences of the floating gates and fill up the gaps between the silicon pillars 12 in the direction of a row.

⑤ An interlayer insulation film 10 is formed.

⑥ The interlayer insulation film 10 on the silicon pillars 12 is removed, and deposition and patterning of a metal film are performed to form bit lines 11. By the process, a three-dimensional EEPROM flash memory is produced.

With the conventional process of production described above, since silicon pillars are formed by etching of a substrate, it is difficult to form the silicon pillars with an equal height. While the height is an important parameter which determines the channel length of a memory cell transistor, since silicon pillars of memory cell transistors produced by the conventional process exhibit a dispersion in height, they exhibit a large dispersion in threshold value $V_T$ upon erasure and writing of data, resulting in a drawback that the memory cell exhibits a high degree of possibility in malfunction (error in read-out).

Further, in the memory cell described above, upon erasure of data, a high voltage is applied to the source region 7 to remove electrons from the floating gates (polycrystalline silicon film 5). In this instance, the gate oxide film 4 is used as a tunnel oxide film. Since the gate oxide film is obtained by thermal oxidation of the silicon substrate 1 which has been damaged by etching performed for the formation of the silicon pillars, the gate oxide film reflects some of defects of the silicon substrate 1 and cannot be formed as a film of a high quality. Consequently, there is a problem in that the memory cell is Inferior in write repeat characteristics and erasure characteristics.

Also in a non-volatile semiconductor storage apparatus and a process of production of the same disclosed in Japanese Patent Laid-Open Application No. Heisei 6-112503, upon formation of a tunnel oxide film, a groove is formed on a silicon substrate by etching, and a floating gate, an interlayer insulation film, a control gate and so forth are formed in the groove. In this instance, since the tunnel oxide film is formed by thermal oxidation of the bottom and the side walls of the groove of the silicon substrate which has been damaged by the preceding etching, there is a problem in that the tunnel oxide film has a degraded film quality, which deteriorates the reliability of the memory cell.

SUMMARY OF THE INVENTION

It is an object of the present invention to provide a non-volatile semiconductor storage apparatus wherein the dispersion in height of silicon pillars can be minimized and a tunnel oxide film of a high quality can be formed from a silicon substrate which remains clean thereby to assure a good repeat characteristic in writing and erasure of a memory cell and a good data holding characteristic.

In order to attain the object described above, according to an aspect of the present invention, there is provided a non-volatile semiconductor storage apparatus, comprising a silicon substrate, a plurality of epitaxial silicon pillars formed in a matrix by epitaxial growth of silicon single crystal, a source region formed on the silicon substrate between the epitaxial silicon pillars, a plurality of drain regions formed on the epitaxial silicon pillars, a plurality of bit lines for individual columns of the matrix formed on the drain regions for interconnecting the drain regions in a direction of each column of the epitaxial silicon pillars, a plurality of first gate insulation films formed between the epitaxial silicon pillars and extending from the silicon substrate to side faces of the epitaxial silicon pillars, a plurality of floating gates surrounding the side faces of the epitaxial silicon pillars with the first gate insulation films interposed therebetween, a plurality of second gate insulation films covering over the floating gates, and a plurality of control gates located in gaps between the epitaxial silicon pillars in a direction of a row and extending continuously In the direction of a row.

Preferably, the distance between the epitaxial silicon pillars in the direction of a column is larger than the distance between the epitaxial silicon pillars in the direction of a row, and the control gates are separated from each other in the direction of a column.

According to another aspect of the present invention, the non-volatile semiconductor apparatus described above is produced by a process which comprises the steps of forming an insulation film on a silicon substrate and forming a plurality of perforations in the insulation film, selectively growing silicon using the insulation film as a mask to form a single crystal epitaxial layer in the form of pillars, forming a first gate insulation film over an overall area by thermal oxidation, performing deposition and etching back of polycrystalline silicon to form a plurality of floating gates on side faces of the pillars of the single crystal epitaxial layer, implanting an impurity to form a high concentration diffusion layer at the tops of the pillars of the single crystal epitaxial layer and the surface of the silicon substrate which is not covered with the single crystal silicon layer and the floating gates, forming a second gate insulation film on the surfaces of the floating gates, performing deposition and etching back of polycrystalline silicon to form a plurality of control gates which cover over side faces of the floating gates and fill up gaps between the pillars of the single crystal epitaxial layer in a direction of a row, and forming a plurality of bit lines for interconnecting the high concentration diffusion layer formed at the tops of the pillars of the single crystal epitaxial layer in the direction of a column.

With the non-volatile semiconductor storage apparatus and the process of producing the same according to the present invention, since the silicon pillars which serve as channel regions are formed by selective epitaxial growth, the dispersion in channel length can be minimized. Consequently, the dispersion in threshold voltage upon writing and upon erasure can be minimized, and accordingly, a malfunction of the memory can be prevented. Further, since the gate insulation film (gate oxide film) through which tunneling of electrons occurs upon erasure can be formed by thermal oxidation of a silicon substrate which has not been damaged by etching, the gate oxide film can be formed with a high quality. Accordingly, otherwise possible deterioration of the gate oxide film is suppressed, and the repeat number is improved remarkably.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 6:
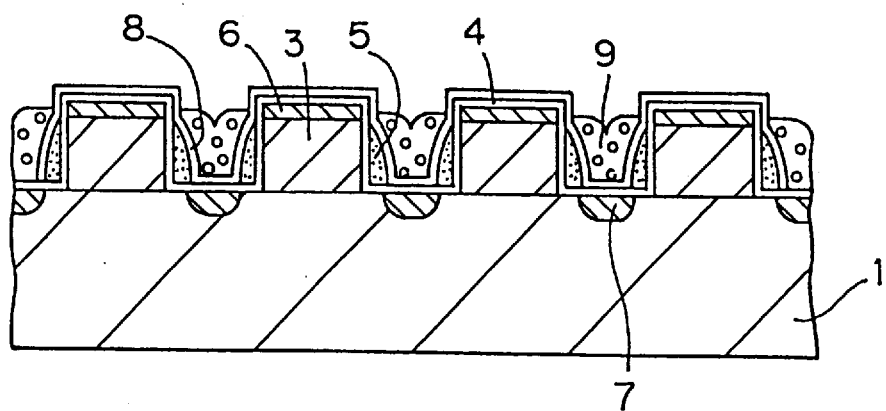
Figure 7:
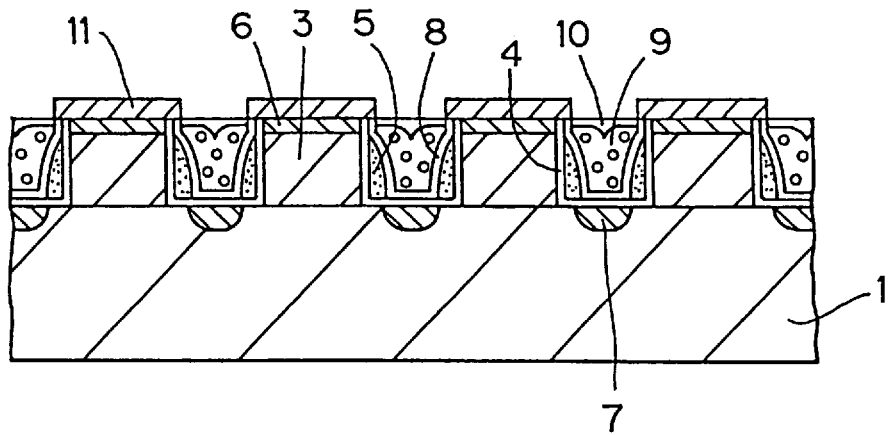
Figure 8:
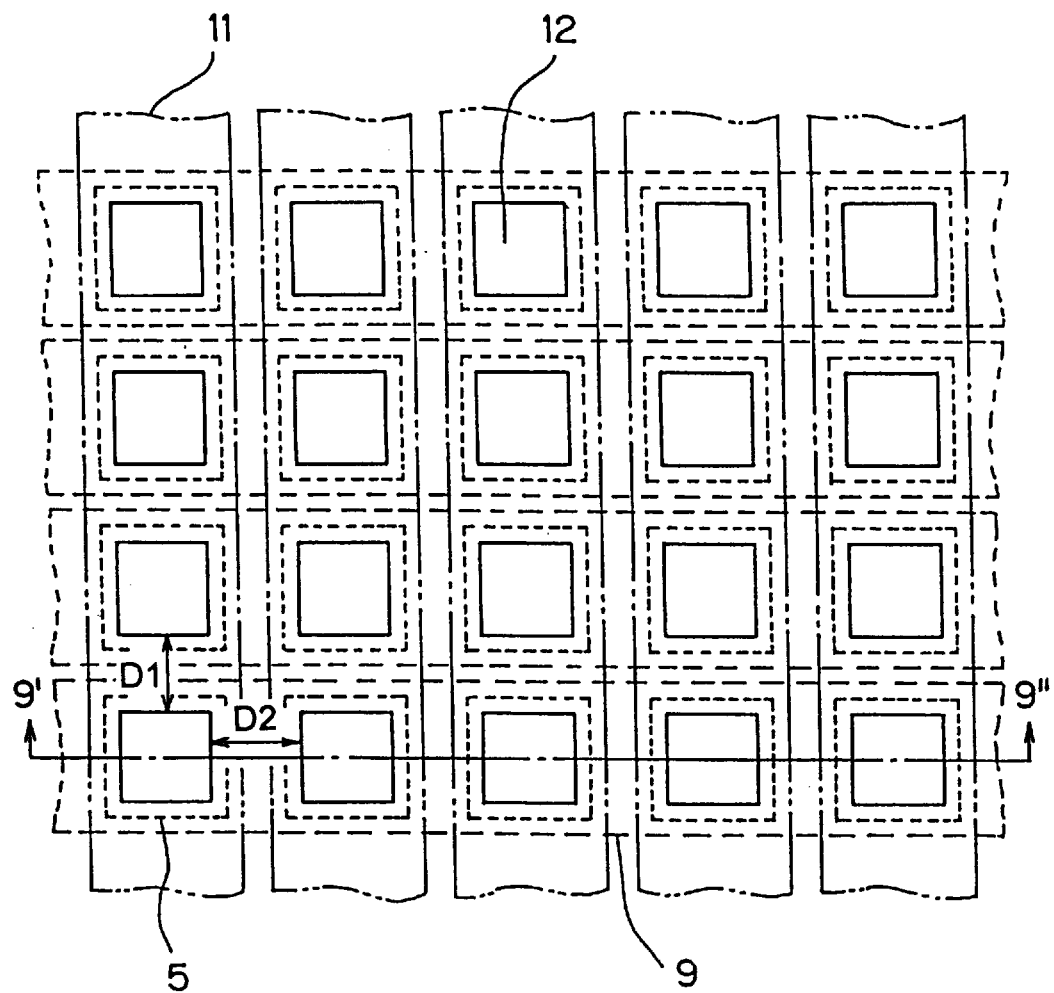
FIG. 8 is a schematic plan view showing a conventional non-volatile semiconductor storage apparatus.
Figure 9:
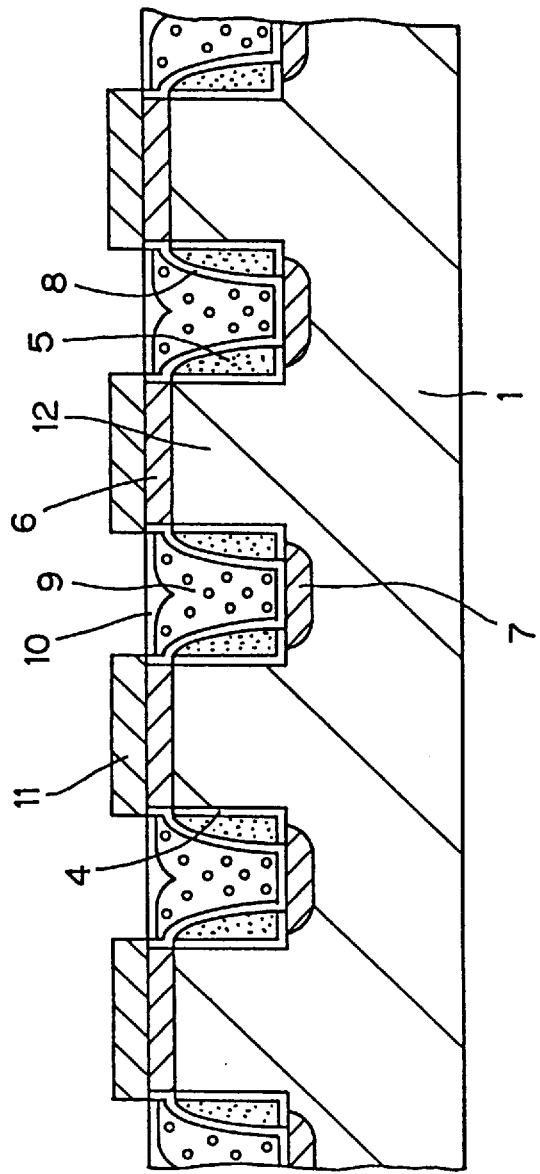
FIG. 9 is a schematic sectional view taken along line 9'–9" of FIG. 8.

A non-volatile semiconductor storage apparatus to which the present invention is applied is produced by a process which includes such successive steps as illustrated in FIGS. 1 to 7. An EEPROM produced as such non-volatile semiconductor storage apparatus by the process has such a top plan as shown in FIG. 8, and the cross sections of FIGS. 1 to 7 are taken along a line corresponding to the line 9'–9" in FIG. 8 and accordingly correspond to the section of FIG. 9.

Figure 1:
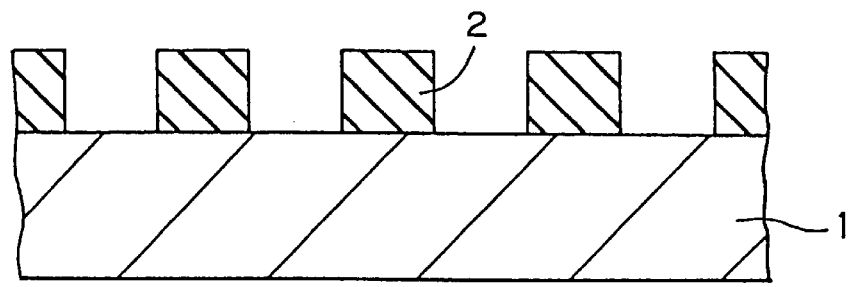
FIGS. 1 to 7 are schematic sectional views showing different steps of a process of production of a non-volatile semiconductor storage apparatus to which the present invention is applied.

In the process, a silicon oxide film 2 approximately 1 $\mu$m thick is first formed on a p-type silicon substrate 1 by a thermal oxidation method or a CVD (Chemical Vapor Deposition) method, and then, the silicon oxide film 2 in regions in which silicon pillars are to be formed is removed using a photo-lithography technique or a dry etching method as seen in FIG. 1.

The step described above may be modified in the following manner. In particular, a thin silicon oxide film and a thick (approximately 1 $\mu$m thick) silicon nitride film are formed on a silicon substrate, and the silicon nitride film is selectively removed by a dry etching method and then the thin oxide film is etched by a wet etching method.

Figure 2:
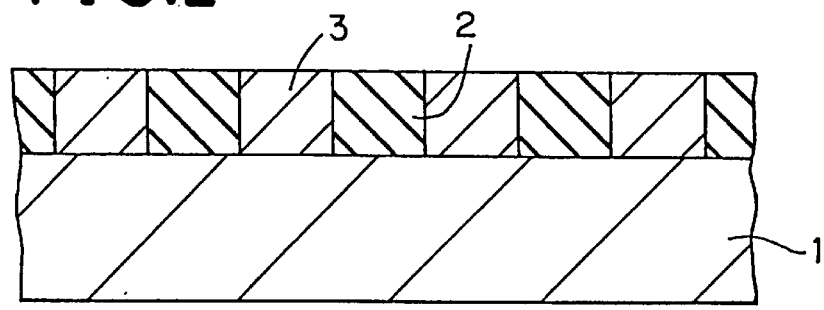

Then, silicon single crystal containing a p-type impurity is epitaxially grown to the thickness of approximately 1 $\mu$m on the p-type silicon substrate 1 exposed by the step of FIG. 1 using the silicon oxide film 2 as a mask to form epitaxial silicon pillars 3 arranged in a matrix as seen in FIG. 2. The single crystal epitaxial layer is formed by an ordinary selective epitaxial growth method such as a thermal decomposition method or a hydrogen reduction method.

In this instance, the epitaxial silicon pillars 3 are formed so that they are spaced away from each other by 1.2 $\mu$m in the direction D1 of a column and by 1.0 $\mu$m in the direction D2 of a row as seen in FIG. 8.

Figure 3:
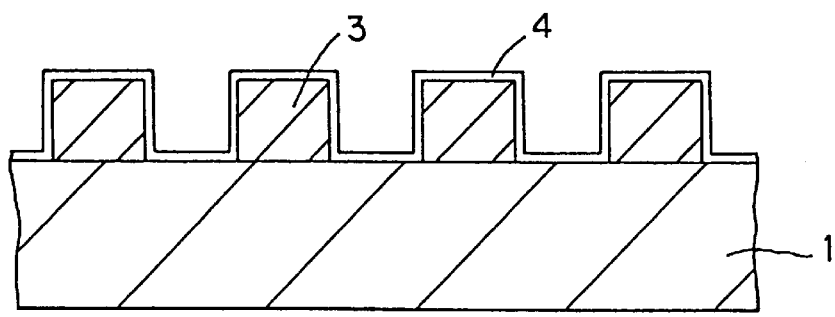

Then, the silicon oxide film 2 is removed, and the surfaces of the silicon substrate 1 and the epitaxial silicon pillars 3 are thermally oxidized to form a gate oxide film 4 of 150 angstrom thickness as seen in FIG. 3.

Figure 4:
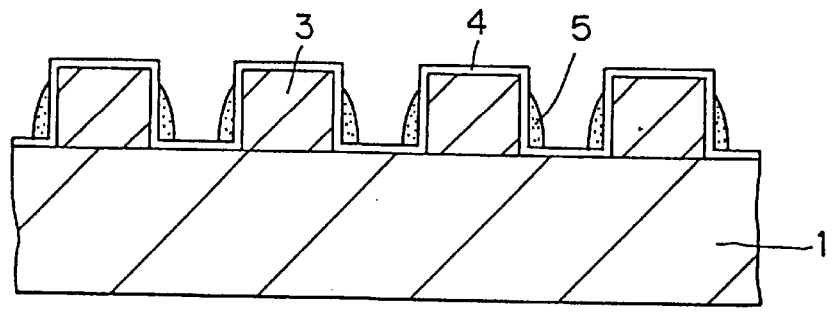

Thereafter, in order to form floating gates, polycrystalline silicon is grown to the film thickness of 2,000 angstroms over the overall area by a CVD method and phosphor is diffused into the polycrystalline silicon film to reduce the resistance of the polycrystalline silicon film. Then, the polycrystalline silicon film is etching by an etching method of a high anisotropy such as RIE so that it may remain only on the side walls of the epitaxial silicon pillars 3 to form a first polycrystalline silicon film 5 serving as floating gates as seen in FIG. 4. In this instance, the first polycrystalline silicon film 5 is etched so that it may be located by at least 0.3 $\mu$m below the tops of the epitaxial silicon pillars 3.

Figure 5:
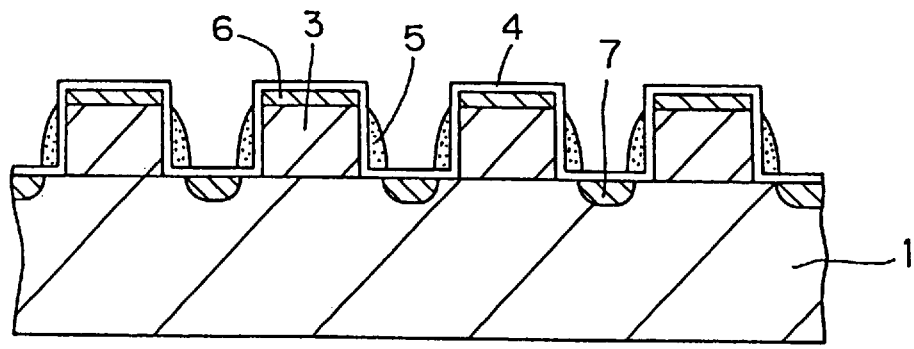

Then, in order to form sources and drains, arsenic is implanted by approximately $7 \times 10^{15}$ atoms/cm$^2$ normally to the surface of the silicon substrate 1 by an ion implantation method. Consequently, drain regions 6 are formed at the tops of the epitaxial silicon pillars 3, and a source region 7 is formed in the region of the silicon substrate 1 in which the epitaxial silicon pillars 3 are not present as seen in FIG. 5.

Then, a layered insulation film 8 of three layers of a silicon oxide film, a silicon nitride film and another silicon oxide film is deposited to a total film thickness of approximately 250 angstroms over the overall surface of the p-type silicon substrate 1.

Then, in order to form control gates, polycrystalline silicon is deposited to the film thickness of 4,700 angstroms by a CVD method and phosphor is dispersed into the polycrystalline silicon film to reduce the resistance of the polycrystalline silicon film. Then, anisotropic etching such as RIE is performed to the polycrystalline silicon film by an amount greater by approximately 1,000 angstroms than the thickness of the polycrystalline silicon film to form, on the side walls of the epitaxial silicon pillars 3, a second polycrystalline silicon film 9 serving as control gates. In this instance, the second polycrystalline silicon film 9 is separated by and between the epitaxial silicon pillars 3 in the direction of a column in which the distance between the epitaxial silicon pillars 3 is greater than 1 μm, but the second polycrystalline silicon film 9 is not separated in the direction of a row in which the distance between the epitaxial silicon pillars 3 is 1 μm. Consequently, the second polycrystalline silicon film 9 is formed as a conductive layers extending continuously in the direction of a row as seen in FIG. 6. The second polycrystalline silicon film 9 functions also as word lines (refer to FIG. 8).

Thereafter, an interlayer insulation film 10 is formed to flatten the surface. Then, the interlayer insulation film 10, the layered insulation film 8 and the gate oxide film 4 are selectively etched to expose the drain regions 6 of the epitaxial silicon pillars 3. Then, a metal material such as aluminum is deposited by a sputtering method or the like, and a photo-lithography method and a dry etching method are applied to form bit lines 11 which commonly connect the drain regions 6 in the direction of a column as seen in FIG. 7.

With the memory cell formed in this manner, since the dispersion in height of the silicon pillars is minimized, the channel length is fixed among the memory cell transistors, resulting in minimized dispersion of the threshold voltage $V_T$. Further, a gate oxide film through which tunneling of electrons occurs upon erasure can be formed by thermally oxidizing the surface of a clean silicon substrate.

Having now fully described the invention, it will be apparent to one of ordinary skill in the art that many changes and modifications can be made thereto without departing from the spirit and scope of the invention as set forth herein.

What is claimed is:

1. A process of producing a non-volatile semiconductor apparatus, comprising steps of:

forming an insulation film on a silicon substrate and forming a plurality of perforations in said insulation film;

growing silicon using said insulation film as a mask to form a single crystal epitaxial layer in the form of pillars;

removing entirely said insulation film to expose a surface of said silicon substrate not covered with said single crystal epitaxial layer;

forming, by thermal oxidization, a first gate insulation film over an area encompassing said pillars of the single crystal epitaxial layer and a surface of said silicon substrate not covered with said single crystal epitaxial layer between said pillars;

performing deposition and etching back of polycrystalline silicon to form a plurality of floating gates on side faces of said pillars of the single crystal epitaxial layer;

implanting an impurity to form a diffusion layer at tops of said pillars of the single crystal epitaxial layer and the surface of said silicon substrate which is not covered with said single crystal silicon layer and said floating gates;

forming a second gate insulation film on the surfaces of said floating gates;

performing deposition and etching back of polycrystalline silicon to form a plurality of control gates which cover side faces of said floating gates and fill gaps between said pillars of the single crystal epitaxial layer in a direction of a row; and forming a plurality of bit lines for interconnecting said diffusion layer formed at the tops of said pillars of the single crystal epitaxial layer in a direction of a column.

2. A method of producing a non-volatile semiconductor apparatus as claimed in claim 1, wherein, at the growing step, said pillars of the single crystal epitaxial layer are formed with a height substantially equal to the thickness of said insulating film formed by the insulation film forming step.

3. A method of producing a non-volatile semiconductor apparatus as claimed in claim 1, wherein a distance of the gaps between said pillars of the single epitaxial layer in a direction of a column is set larger than that in a direction of a row.

4. A method of producing a non-volatile semiconductor apparatus according to claim 1, wherein said step of performing deposition and etching back of polycrystalline silicon to form a plurality of control gates which cover side faces of said floating gates forms said control gates at least 0.3 μm below the tops of said pillars.

5. Method according to claim 1, wherein said step of performing deposition and etching back of polycrystalline silicon to form a plurality of control gates which cover side faces of said floating gates forms said polycrystalline silicon along a direction of a column of said pillars.

6. Method according to claim 1, wherein said step of performing deposition and etching back of polycrystalline silicon to form a plurality of control gates which cover side faces of said floating gates forms said polycrystalline silicon along a direction of a column of said pillars, and forms a plurality of lengths of said polycrystalline silicon control gates spaced by a distance of greater than 1 μm along a row direction of said pillars.

* * * * *